United States Patent [19]

Manabe et al.

[11] Patent Number: 4,858,071
[45] Date of Patent: Aug. 15, 1989

[54] ELECTRONIC CIRCUIT APPARATUS

[75] Inventors: Takahiro Manabe, Katano; Mikio Nozu, Yamatokouriyama; Yasuhito Osada, Katano; Hiroyuki Nomura, Fujisawa, all of Japan

[73] Assignees: Nissan Motor Co., Ltd., Kadoma; Matsushita Electric Industrial Co., Ltd., Yokohama, both of Japan

[21] Appl. No.: 159,098

[22] Filed: Feb. 23, 1988

[30] Foreign Application Priority Data

Feb. 24, 1987 [JP] Japan .................. 62-40892

[51] Int. Cl.⁴ ............................. H05K 7/20
[52] U.S. Cl. .................. 361/386; 361/388; 361/395; 361/398; 361/399
[58] Field of Search ............... 361/386–389, 361/392–395, 398, 399, 427

[56] References Cited

U.S. PATENT DOCUMENTS

| 3,971,127 | 7/1976 | Giguere et al. | 361/398 |
| 4,104,701 | 8/1978 | Baranowski | 361/398 |
| 4,495,546 | 1/1985 | Nakamura et al. | 361/398 |
| 4,547,834 | 10/1985 | Dumont et al. | 361/386 |

OTHER PUBLICATIONS

Kerjilian, "High Density Memory Package", IBM Technical Disclosure Bulletin, vol. 27, No. 4B, Sep. 1984, p. 2642.

Primary Examiner—A. D. Pellinen
Assistant Examiner—Gregory D. Thompson
Attorney, Agent, or Firm—Cushman, Darby & Cushman

[57] ABSTRACT

A flexible printed circuit substrate is bent in a flattened rectangular C-shape and electronic parts generating heat are mounted on the inner surface of a central portion of the C-shaped substrate. Then a radiating heatsink plate is adhered on the outer surface of that central portion. Temperature-sensitive electronic parts are mounted on one end portion of the C-shaped substrate and parts consisting of a power supply circuit are mounted on the other end portion. Then the entire assembly is accommodated in a housing having a connector.

12 Claims, 5 Drawing Sheets

ELECTRONIC CIRCUIT APPARATUS

FIELD OF THE INVENTION AND RELATED ART STATEMENT

1. Field of the Invention

The present invention relates generally to an electronic circuit apparatus, and more particularly to an electronic circuit apparatus in which different kinds of electronic parts are mounted on a flexible printed circuit board.

2. Description of the Related Art

Recently, an electronic device having various functions is fabricated using a printed circuit board in which various electronic parts including semiconductor devices such as an integrated circuit, a large scale integrated circuit and a microcomputer are mounted. Especially in commercial use apparatus such as an audio apparatus and communication device, a dense arrangement of the electronic parts in the printed circuit board has been developed, and the electronic device has been miniaturized, thinned and lightened.

Respecting automobile electronic devices, electronic control devices using an integrated circuit, a large scale integrated circuit or a microcomputer are employed for an engine control device or constant speed cruising controllor. Furthermore these electronic devices are introduced into other control devices. Concerning the control device in the automobile, reduction of weight of the automobile and increase of usable room space therein can be realized by miniaturization of the control devices. Moreover, since the miniaturized control devices can be positioned adjacent to an actuator, a wire harness connecting the actuator with the control device can be eliminated. In order to miniaturize the control devices, a dense mounting technology is introduced to fabricate it.

The automobile electronic devices are usually operated in a temperature range from −30° C. to 80° C., and are exposed to severe conditions in comparison with other home appliance apparatuses generally having an operation range from 0° C. to 50° C. Guaranteed operation ranges in the temperature of semiconductor devices such as an integrated circuit, a large scale integrated circuit and a microcomputer are mostly from −30° C. to 85° C. Especially in high end of the temperature range, care has to been exercised to avoid malfunction in operation and damage to semiconductor devices.

In the above-mentioned guaranteed temperature operation range, a margin of the temperature in high end of the actual operation is only 5° C. Moreover, high power electronic parts which generate heat such as a power transistor are generally mounted in the same apparatus, and therefore consideration for arrangement of the electronic parts is required, and miniaturization of the apparatus is not so easy.

OBJECT AND SUMMARY OF THE INVENTION

An object of the present invention is to provide a miniaturized electronic apparatus with dense mounting of electronic parts which has an extended range of guaranteed temperature operation.

That object is accomplished by locating heat sensitive parts remote or separately from heat generating parts and providing heat sink and heat radiating means adjacent the heat generating parts.

According to the above-mentioned construction, heat from the heat-generating electronic parts is radiated from a heat radiating plate, and heat-sensitive electronic parts which must avoid a temperature rise are located apart from the heat-generating electronic parts. Consequently, the electronic parts which must avoid a temperature rise are removed from the thermal influence of the heat generating parts, and miniaturization of the electronic device is realized.

DESCRIPTION OF THE PREFERRED EMBODIMENT

Figure 1:
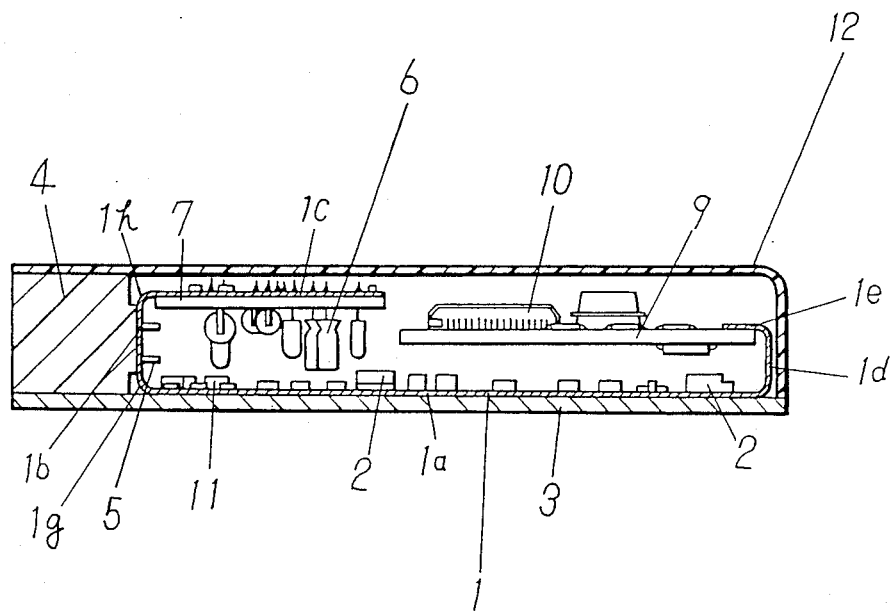
FIG. 1 is a cross-sectional view of an electronic circuit apparatus in a first embodiment of the present invention.
Figure 2:
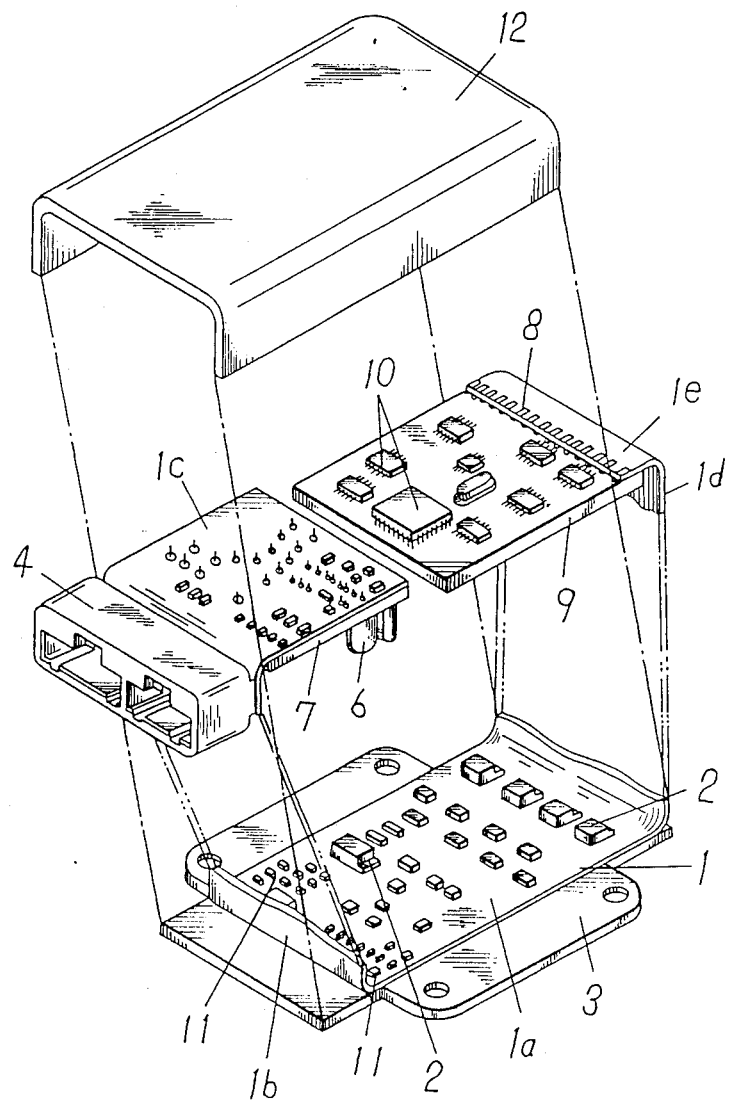
FIG. 2 is an exploded perspective view of the first embodiment.

Referring to FIGS. 1 and 2, a strip-shaped flexible printed circuit substrate 1 is made of a thin flexible plastic film, such as, polyimide film of about 25μ thickness, whereon circuit patterns of wiring conductors are formed by thin copper foil. Mounted on the upper surface of a central portion 1a of the substrate 1 are electronic parts which generate radiate heat, such as power transistors 2 of an output circuit. The lower surface is adhered by an adhesive 13 (FIG. 3) to an aluminum plate 3 which serves as a heat sink and part of the housing of the apparatus. The aluminum plate 3 also serves as a reinforcing plate.

The flexible printed circuit substrate 1 is bent into a flattened rectangular C-shape, and is accommodated in a housing which is composed of the aluminum plate 3 and a cover 12.

A bent portion 1b of the substrate 1 is perpendicular to the central portion 1a, and terminals 5 of a connector 4 are soldered thereon. An end portion 1c of the substrate 1 is perpendicular to the bent portion 1b and is parallel to the central portion 1a. Both corners 1g and 1h between the bent portion 1b and the central portion 1a and end portion 1c are roundly bent. On the inner side of the end portion 1c are mounted discrete electronic parts 6, such as a resistor, capacitor and transistor for a power supply circuit, which are temperature sensitive i.e. temperature rise must be prevented. A reinforcing plate 7 made of hard phenol resin is adhered on the inner side of the end portion 1c and the parts 6 are mounted thereon. The discrete electronic parts 6 such as capacitors are comparatively tall, and therefore, comparatively short parts are mounted preferably on the portion of the substrate 1 facing the end portion 1c.

The other bent portion 1d of the substrate 1 is perpendicular to the central portion 1a and the other end portion 1e is parallel thereto. The corners joining the portion 1a, 1d and 1e are rounded. Connecting lands 8 as shown in FIG. 2, are formed on the edge of the end portion 1e, and a relatively-thick hard or rigid printed circuit substrate 9 is soldered to the connecting lands 8 at respective lands thereof. The electronic parts, which should not be exposed to temperature rise, such as an integrated circuit, a large scale integrated circuit and a microcomputer 10, are preferably mounted on the printed circuit substrate 9 facing away from the control portion 1a. The substrate 9 is spaced from the plate 7 and the electronic parts 6 making considerable heat dissipation.

Electronic parts 11, such as a capacitor and a resistor comprising an input circuit, are mounted adjacent to the connector 4 on the flexible printed circuit substrate 1. The entire substrate 1 is covered by a cover 12 made of plastic. The end portion 1c and the printed circuit substrate 9 which carry comparatively large electronic parts are preferably supported by known supporting means.

Figure 3:
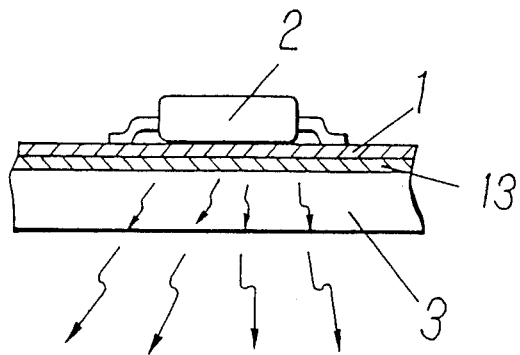
FIG. 3 is an enlarged fragment cross-sectional view of a part of the apparatus shown in FIG. 1 illustrating radiation of heat from an electronic part.

The output circuit which is composed of electronic part 2 such as a power transistor which generate heat is mounted on the central portion 1a of the flexible printed circuit substrate 1. Since the central portion 1a is adhered to the aluminum plate 3 which also serves as a heat sink, heat generated in the electronic parts 2 is conducted through the substrate 1 and adhesive 13 to the aluminum plate 3 and radiated out from the aluminum plate 3, as shown in FIG. 3. In this embodiment, the electronic parts 2 which generate heat, for example a power transistor, are solder-connected by known "surface mounting technology" on the flexible printed circuit substrate 1.

In other mode of mounting method, through-holes are made in the central portion 1a, and the heat-generative electronic parts 2 are mounted on the through-holes. On this modification, a copper foil is sandwiched between the flexible printed circuit substrate 1 and the aluminum plate 3. Consequently, heat conduction from the electronic parts 2 to the aluminum plate 3 is facilitated by the through-holes and the copper foil. The heat sink effect of the aluminum plate 3 is further improved by adherence between the flexible printed circuit substrate 1 and the aluminum plate 3 with a thin layer of adhesive or using an adhesive having high thermal conductivity, whereby the heat of the heat generating electronic parts 2 is effectively radiated out of the apparatus.

The electronic circuit apparatus is generally such an installation in operation. In installment of the electronic circuit apparatus, the aluminum plate 3 is in contact with the other apparatus. Consequently, the heat of the aluminum plate 3 is transmitted to the other apparatus and heat radiation from the aluminum plate 3 is further facilitated. In this case, the apparatus which the aluminum plate 3 contacts is preferably made of metal.

The electronic parts most sensitive to temperature rise, such as a microcomputer 10, are mounted on the printed circuit substrate 9 which is connected to the end portion 1e of the substrate 1. Consequently, these parts are somewhat insulated from the heat-generating output circuit portion on the central portion 1a, and thermal influence on those parts from the central portion 1a is sufficiently prevented. As a result, miniaturization of the electronic circuit apparatus is realized.

The connector 4 for connecting the electronic apparatus with an external apparatus is sandwiched between the aluminum plate 3 and the cover 12, and the terminals 5 of the connector 4 are readily connected with the input and output lands of the flexible printed circuit substrate 1. The input circuit having the electronic parts 11 including a capacitor reforms various signals from the external apparatus and supplies them to the microcomputer 10. A ripple factor of the input signal and noise are also eliminated by the input circuit. The circuit for reforming the signal is preferably located adjacent to the connector 4 on a left end portion, as shown in FIG. 1 of the central portion 1a of the flexible printed circuit substrate 1. The signal reformed in the input circuit is transmitted to the printed circuit substrate 9 via other portions of the central portion 1a of the flexible printed circuit substrate 1.

The aluminum plate 3 to which the flexible printed circuit substrate 1 is adhered is preferably grounded so that a capacitor is formed between the printed circuit of copper foil on the substrate 1 and the aluminum plate 3. Consequently, electric noise from the external apparatus is eliminated by this capacitance. Consequently, an electronic circuit apparatus which is resistant to external noise can be realized.

A second embodiment of the present invention is shown in FIGS. 4–8. In this embodiment, all electronic parts are mounted on one sheet of a flexible printed circuit substrate i.e. an integral substrate, and the hard phenol resin plate 7 and the hard printed circuit substrate 9 used in the first embodiment are omitted.

Figure 4:
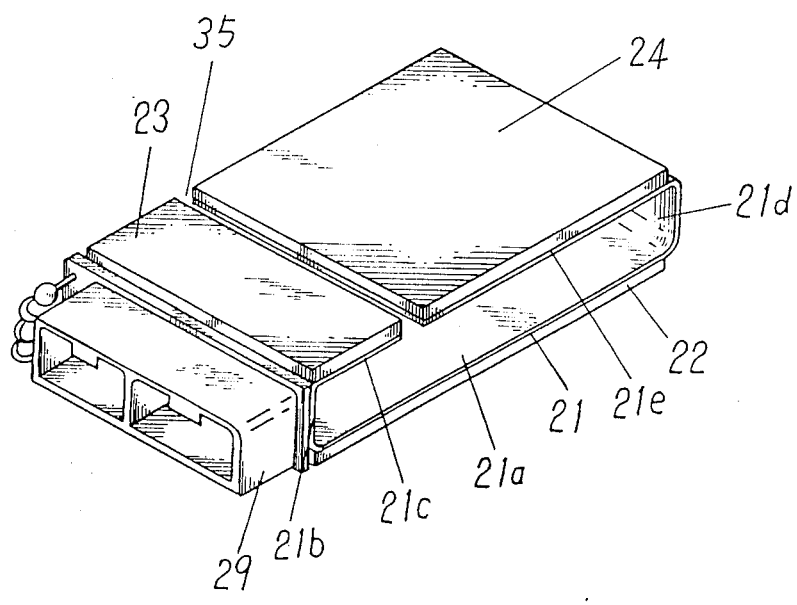
FIG. 4 is a perspective view of an electronic circuit apparatus without a cover in a second embodiment of the present invention.

Referring to FIG. 4, a flexible printed circuit substrate 21 is a thin plastic film such as polyimide on which circuit patterns are formed by copper foil. The flexible printed circuit substrate 21 is bent in a flattened rectangular C-shape. Respective corners are bent orthogonally with roundish tops. One end portion 21c of the substrate 21 is shorter than the other end portion 21e. An aluminum plate 22 is adhered on the outer surface of a central portion 21a of the substrate 21, another aluminum plate 23 is adhered on the outer surface of the end portion 21c, and further aluminum plate 24 is adhered on the outer surface of the turned portion 21e. These aluminum plates 22, 23 and 24 serve both as heat sinks and reinforcing plates.

Figure 5:
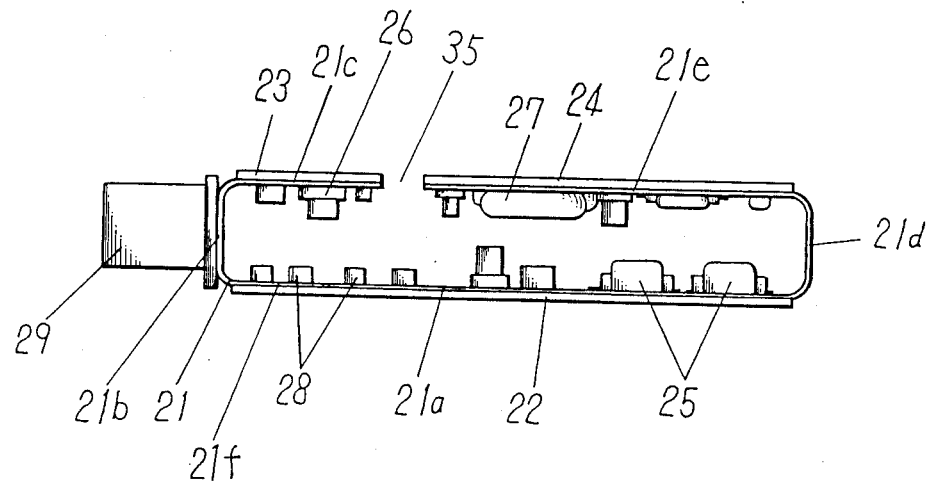
FIG. 5 is a side view of the second embodiment shown in FIG. 4.

As shown in FIG. 5, heat-generating surface-mounting type electronic parts 25, such as a power transistor, of an output circuit are soldered on the inner surface of the central portion 21a of the substrate 21. Surface mounting type electronic parts comprising a power supply unit 26 and other parts which should avoid temperature rise are mounted on the inner surface of the end portion 21c. Soldered on the inner surface of the end portion 21e are surface-mounting type electronic parts which should avoid temperature rise comprising a control circuit, including a semiconductor device 27, such as an integrated circuit, a large scale integrated circuit and a microcomputer. Electronic parts 28 of the surface mounting type comprising an input circuit are mounted on the inner surface of the left portion 21f (as shown in FIG. 5) of the central portion 21a facing the end portion 21c. A connector 29 for connecting the electronic circuit apparatus with an external apparatus is fastened on the outer surface of the bent portion 21b, and the terminals of the connector 29 are coupled to wiring conductors of the flexible printed circuit substrate 21.

The wiring conductors for connecting between the respective circuit portions are formed on both the bent portions 21b and 21d.

Figure 6:
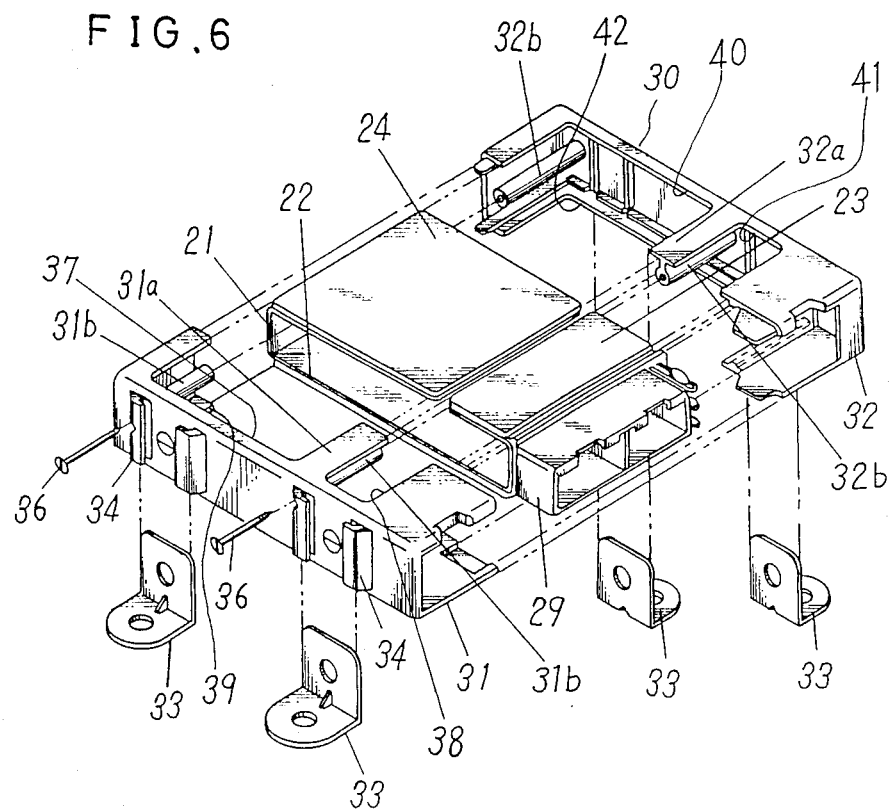
FIG. 6 is an exploded perspective view of the second embodiment shown in FIG. 4.
Figure 7:
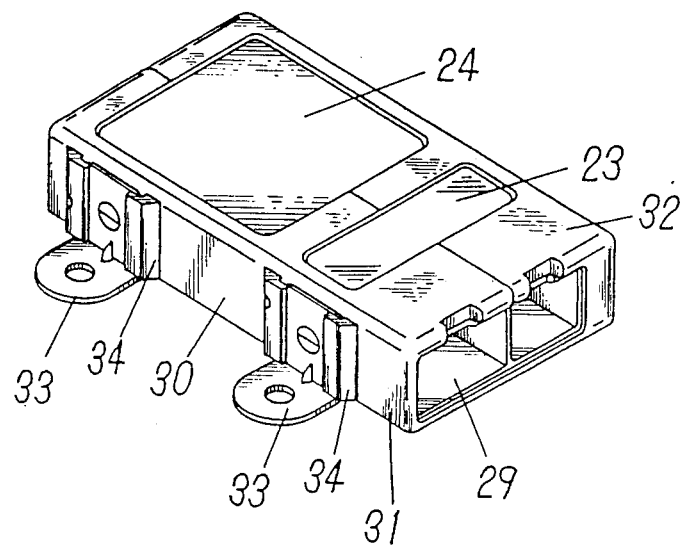
FIG. 7 is a perspective view showing the complete apparatus of the second embodiment.

The flexible printed circuit substrate 21 on which above-mentioned various types of the electronic parts are mounted is accommodated in a housing 30 made of insulating material, such as a plastic as shown in FIG. 6. The housing 30 is composed of a first frame 31 and a second frame 32. The side and end edges of the flexible printed circuit substrate 21 is covered with both the frames 31 and 32 as shown in FIG. 6. Pair of holding members 34 for holding L-shaped brackets 33 are formed on the sides of the respective frames 31 and 32 which also have facing beams 31a and 32a, respectively. The beams 31a and 32a are inserted into the gap 35 between the end portions 21c and 21e when the frames 31 and 32 are assembled to cover the edges of the flexible printed circuit substrate 21, and thereby the opposed end edges of the end portions 21c and 21e are held with a predetermined spacing. The frame 31 has U-shaped openings 37, 38 and 39, and the frame 32 also has U-shaped openings 40, 41 and 42. When the frames 31 and 32 are assembled and cover the edges of the flexible printed circuit substrate 21, a rectangular opening for exposing the aluminum plate 24 is formed by the two U-shaped openings 37 and 40, a rectangular opening for exposing the aluminum plate 23 is formed by the two U-shaped openings 38 and 41, and a rectangular opening for exposing the aluminum plate 22 is formed by the two U-shaped openings 39 and 42. After assembling the frames 31 and 32 are connected by two screws 36 which are screwed through and into two pairs of opposing posts 31b and 32b, respectively.

Consequently, the flexible printed circuit substrate 21 is covered by the frames 31 and 32 except for the exposed surfaces of the aluminum plates 22, 23 and 24 and the connector 29. Since the most of the surfaces of the aluminum plates 22, 23 and 24 are exposed, heat generated by the electronic parts mounted on the flexible printed circuit substrate 21 are effectively radiated from the exposed surfaces of the aluminum plates 22, 23 and 24.

Figure 8:
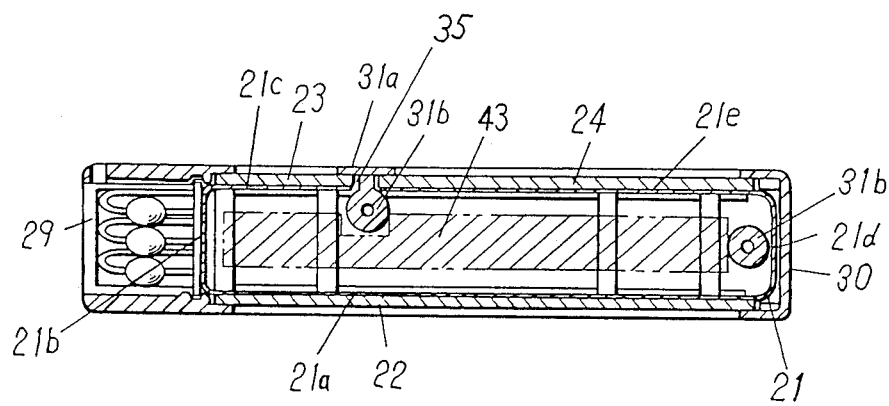
FIG. 8 is a cross-sectional side view showing the arrangement of a neat insulating member for the apparatus as shown in FIG. 5.

Furthermore, as shown in FIG. 8, a heat insulating material 43 such as urethane foam may be inserted between the central portion 21a and the end portions 21c and 21d for insulating the electronic parts on the end portions 21c and 21d from heat generated by the electronic parts on the central portion 21a.

As mentioned above, in the electronic circuit apparatus in accordance with the present invention, heat generated by the electronic parts mounted on the flexible printed circuit substrate is radiated from a radiating plate or plates which is adhered thereto. Moreover, the parts which are required to avoid temperature rise are mounted apart from the temperature-sensitive parts generating heat, thereby the heat influence is avoided. Furthermore, connection between the connector and the flexible printed circuit substrate is simplified by the bending of the flexible printed circuit substrate. Consequently, the electronic circuit apparatus may be miniaturized.

What is claimed is:

1. An electronic apparatus comprising:
a flexible printed circuit substrate having wiring conductors of a predetermined pattern on which electronic parts are mounted, said flexible printed circuit substrate comprising:
a first area having mounted thereon electronic parts which generate heat,
a second area continuous with and bent substantially perpendicular to said first area and having means for connecting an external device,
a third area continuous with and bent substantially perpendicular to said second area and facing said first area and having mounted thereon electronic parts which are to avoid temperature rise,
a fourth area continuous with and bent substantially perpendicular to said first area, said fourth area being spaced from and substantially parallel to said second area, and
a fifth area continuous with and bent substantially perpendicular to said fourth area, said fifth area having connected thereto electronic parts which are to avoid temperature rise,
a heat radiating plate disposed on an outer surface of said first area facing away from said third area, and
a housing accommodating said flexible printed circuit substrate while covering at least a portion of said plate exposed to atmosphere.

2. An electronic circuit apparatus in accordance with claim 1, wherein
a reinforcing plate is disposed on an outer surface of said third area.

3. The apparatus defined in claim 1 including a rigid printed circuit substrate generally parallel with and connected to said fifth area and having mounted thereon the electronic parts which are connected to said fifth area.

4. The apparatus defined in claim 3 wherein the electronic parts on the rigid substrate are mounted on that side thereof facing away from the first area.

5. The apparatus defined in claim 1 wherein the electronic parts connected to the fifth area are mounted thereon on that side thereof facing the first area.

6. The apparatus defined in claim 1 wherein the heat radiating plate disposed on the first area forms a part of the housing.

7. The apparatus defined in claim 1 including a heat insulating member disposed between the first area and the third and fifth areas.

8. The apparatus defined in claim 1 including heat radiating plates disposed on those surfaces of the third and fifth areas facing away from the first area.

9. An electronic circuit apparatus in accordance with claim 8, wherein
the heat radiating plates are made of aluminum.

10. An electronic circuit apparatus in accordance with claim 8, wherein
the heat radiating plates are adhered on the flexible printed circuit substrate.

11. The apparatus defined in claim 8 wherein the heat radiating plates form a part of the housing.

12. The apparatus defined in claim 11 wherein the housing includes a pair of frames of plastic material.

* * * * *

UNITED STATES PATENT AND TRADEMARK OFFICE
CERTIFICATE OF CORRECTION

PATENT NO. : 4,858,071

DATED : August 15, 1989

INVENTOR(S) : Takahiro MANABE, et al.

It is certified that error appears in the above-identified patent and that said Letters Patent is hereby corrected as shown below:

On the title page, the assignment data should read as follows:

-- [73] Assignees: Nissan Motor Co., Ltd., Yokohama;

Matsushita Electric Industrial Co., Ltd., Kadoma, both of Japan --

Signed and Sealed this

Fifteenth Day of October, 1991

Attest:

HARRY F. MANBECK, JR.

*Attesting Officer*

*Commissioner of Patents and Trademarks*